United States Patent
Bhagwat

(10) Patent No.: US 10,594,519 B2
(45) Date of Patent: Mar. 17, 2020

(54) POWER OVER DATA LINES SYSTEM USING PAIR OF DIFFERENTIAL MODE CHOKES FOR COUPLING DC VOLTAGE AND ATTENUATING COMMON MODE NOISE

(71) Applicant: Linear Technology Holding LLC, Norwood, MA (US)

(72) Inventor: Gitesh Bhagwat, Santa Barbara, CA (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

(21) Appl. No.: 16/396,566

(22) Filed: Apr. 26, 2019

(65) Prior Publication Data
US 2019/0342123 A1    Nov. 7, 2019

Related U.S. Application Data

(60) Provisional application No. 62/665,265, filed on May 1, 2018.

(51) Int. Cl.
*H04L 25/02* (2006.01)
*H04B 3/56* (2006.01)
(Continued)

(52) U.S. Cl.
CPC ........ *H04L 25/0272* (2013.01); *G06F 1/3234* (2013.01); *H04B 3/56* (2013.01);
(Continued)

(58) Field of Classification Search
None
See application file for complete search history.

(56) References Cited

U.S. PATENT DOCUMENTS 5,659,273 A    8/1997    Harpham
6,304,065 B1   10/2001   Wittenbreder
(Continued)

FOREIGN PATENT DOCUMENTS

CN    101369480 A    2/2009
CN    105634432 A    6/2016
(Continued)

OTHER PUBLICATIONS

PCT/US2019/029651, "International Search Report and Written Opinion," dated Jul. 19, 2019, 12 pages.
(Continued)

*Primary Examiner* — Lincoln D Donovan
*Assistant Examiner* — Khareem E Almo
(74) *Attorney, Agent, or Firm* — Patent Law Group; Brian D. Ogonowsky

(57) ABSTRACT

In a Power over Data Lines (PoDL) system that conducts differential data and DC power over the same wire pair, various DC coupling techniques are described that improve DC voltage coupling while attenuating AC common mode noise. Pairs of differential mode chokes (DMCs) are used to share current supplied by a single phase or multi-phase power supply. In one embodiment, one DMC is coupled to the line side of a common mode choke (CMC), and one DMC is coupled to the PHY side of the CMC. The line-side DMC has windings that are loosely magnetically coupled so that DMC does not present a very low impedance to AC common mode noise on the wires. Therefore, the performance of the wires' RC termination circuitry is not adversely affected by the line-side DMC when minimizing reflections of common mode signals.

23 Claims, 12 Drawing Sheets

(51) Int. Cl.
*H04L 12/40* (2006.01)
*G06F 1/3234* (2019.01)

(52) U.S. Cl.
CPC .... *H04L 12/40045* (2013.01); *H04L 25/0282* (2013.01); *H04L 25/0298* (2013.01)

(56) References Cited

U.S. PATENT DOCUMENTS

| | | | | |
|---|---|---|---|---|
| 9,100,105 | B2* | 8/2015 | Yamamoto | H04B 3/54 |
| 9,225,558 | B2* | 12/2015 | Schwager | H04B 3/30 |
| 9,641,221 | B2* | 5/2017 | Blasco Claret | H04L 25/0272 |
| 9,838,081 | B1* | 12/2017 | Hallamasek | H04B 3/56 |
| 10,075,144 | B2* | 9/2018 | Standish | H04B 3/44 |
| 10,205,539 | B2* | 2/2019 | Chini | H04B 15/005 |
| 10,333,742 | B1* | 6/2019 | Bhagwat | H02M 3/335 |
| 10,382,005 | B2* | 8/2019 | Gardner | H04L 12/40045 |
| 10,382,216 | B1* | 8/2019 | Bhagwat | H04B 3/548 |
| 10,404,502 | B2* | 9/2019 | Gardner | H03H 7/427 |
| 2006/0220772 | A1 | 10/2006 | Suzuki et al. | |
| 2010/0308851 | A1 | 12/2010 | Schwager et al. | |
| 2011/0268258 | A1 | 11/2011 | Alloin et al. | |
| 2013/0320753 | A1 | 12/2013 | Kim et al. | |
| 2016/0314895 | A1 | 10/2016 | Shiokawa | |
| 2017/0301455 | A1* | 10/2017 | Kobayashi | H01F 27/24 |
| 2018/0026525 | A1 | 1/2018 | Gardner | |
| 2018/0097497 | A1 | 4/2018 | Kobayashi et al. | |
| 2019/0199401 | A1 | 6/2019 | Pandey et al. | |
| 2019/0288862 | A1 | 9/2019 | Bhagwat | |

FOREIGN PATENT DOCUMENTS

| | | |
|---|---|---|
| DE | 202018101132 | 6/2018 |
| EP | 1830608 A1 | 9/2007 |

OTHER PUBLICATIONS

PCT/US2019/029656, "International Search Report and Written Opinion," dated Jul. 19, 2019, 13 pages.

* cited by examiner

POWER OVER DATA LINES SYSTEM USING PAIR OF DIFFERENTIAL MODE CHOKES FOR COUPLING DC VOLTAGE AND ATTENUATING COMMON MODE NOISE

CROSS-REFERENCE TO RELATED APPLICATIONS

This application is based on and claims priority from U.S. Provisional Application Ser. No. 62/665,265, filed May 1, 2018, by Gitesh Bhagwat, incorporated herein by reference.

FIELD OF THE INVENTION

The invention relates to Power over Data Lines (PoDL) systems, where DC power and differential data are provided over the same twisted wire pair, and, in particular, to techniques for increasing the deliverable DC power, improving the attenuation of common mode noise, and reducing the differential mode insertion loss while easing requirements for a common mode choke (CMC).

BACKGROUND

The US patent application publications 2018/0026525 and 2018/0024620 describe various configurations of PoDL systems that use combinations of CMCs and differential mode chokes (DMCs) to attenuate common mode noise while providing DC power to a twisted wire pair.

FIG. 1 is an example of one type of PoDL system described in the aforementioned publications. A PHY 10 outputs differential data and receives differential data via a conventional Media Dependent Interface (MDI) connector 12 coupled to wires 14 and 16 of a twisted wire pair. PHY 10 represents the physical layer in the OSI model and is a transceiver that typically includes signal conditioning and decoding circuitry for presenting bits to the next stage. The term PHY is a term of art and is defined by various IEEE standards, depending on the particular application. The PHY 10 is typically an integrated circuit. A digital processor (not shown) is coupled to the PHY 10 for processing the data.

The PHY 10 is connected to the MDI connector 12 via a CMC 18 and AC coupling capacitors C1 and C2. Termination resistors R1 and R2 and capacitors C3 and C4 are coupled to the wires 14 and 16, via the MDI connector 12, to eliminate reflections of the common mode noise on the twisted wire pair. The termination circuitry is generally designed to match the common mode impedance of the wire pair for maximum energy absorption and minimum reflectance while preserving the differential mode impedance presented by the transceiver. Other types of termination circuits can also be used.

The CMC 18 is an in-line transformer with two windings, where each winding is in series with a wire in the twisted wire pair. As shown by the dots on the CMC 18 windings, the windings have the same polarity, so the magnetic fields generated by a differential mode signal are substantially cancelled out. Thus, the CMC 18 presents little inductance or impedance to differential-mode currents. Common mode currents, such as ambient noise in the wire pair, however, see a high impedance due to the combined inductances of the windings.

The CMC 18 ideally eliminates or greatly attenuates common mode RF noise while providing no loss for the differential or DC voltage signals.

CMCs must present a low insertion loss to the differential data. However, CMCs have constraints which can impede their performance. Such constraints include inter-winding capacitance, DC resistance (DCR) of the windings, core loss, and limits on the current that can flow through the windings.

A DMC 20 is coupled between the MDI connector 12 and a DC power supply 22. The power supply 22 has a low output impedance as is characteristic of a voltage source. The DMC 20 has windings with opposite polarities (dots on opposite ends). The DMC 20 presents a high impedance to AC differential mode signals while it shunts the common mode signals to the power supply 22 due to its low impedance to common mode signals. Therefore, the combination of the CMC 18 and the DMC 20 can substantially remove AC common mode noise that has been coupled to the wire pair, especially at relatively low frequencies.

Since the DMC 20 improves the AC common mode rejection, the CMC 18 windings can be fabricated to have a lower inductance value, reducing the number of turns required, which affords benefits such as reducing the DCR of the CMC windings and reducing the parasitic capacitance. Alternatively, the CMC inductance can stay the same and the overall AC common mode rejection may be increased by the shunting action of the DMC 20.

However, there still exists a drawback with the configuration of FIG. 1. The DMC 20, in combination with the low impedance to ground of the power supply 22, will likely distort the common mode matching impedance provided by the RC termination circuitry, which was designed to eliminate reflections of the common mode noise signals. In other words, the termination circuitry, comprising the resistors R1 and R2 and capacitors C3 and C4, is designed to have an impedance that prevents reflections of the common mode signals while the low impedance by the DMC 20 to the AC common mode signals causes the resulting termination impedance (created by the RC circuitry and the DMC 20) to not be optimal to eliminate reflections of the AC common mode signals. Therefore, there may be some reflections of the AC common mode noise signals.

One way to avoid the DMC 20 adversely interfering with the operation of the termination circuitry for AC common mode noise signals is to place the DMC 20 on the PHY 10 side of the CMC 18, as shown in FIG. 2. In FIG. 2, the operation of the DMC 20 does not have a significant adverse effect on the RC termination circuitry, but now all the current transmitted by the power supply 22 must flow through the CMC 18, which requires that the CMC 18 be much more robust. Such a robust design requires a lower DC winding resistance and makes the CMC 18 more bulky and expensive compared to the CMC 18 in FIG. 1 for the same power requirements of the powered device (PD) connected to the other ends of the wires 14 and 16.

In FIGS. 1 and 2, the DMC 20 is designed to have a strong magnetic coupling between the windings. This rating is sometimes referred to in the DMC's data sheet as its "coupling coefficient" or the "coefficient of magnetic field coupling." Such a high coupling coefficient is typically greater than 0.95. The absolute value of the coupling coefficient can be derived from the amount of leakage inductance. This leakage inductance translates to a frequency-dependent impedance which can be compared to the transmitter's or cable's differential mode or common mode impedance to determine whether this is a low enough or high enough value. This strong magnetic coupling of the DMC windings is also referred to as the DMC windings being "tightly coupled". By virtue of the tight coupling, such a DMC presents a very low impedance to common mode signals. On the other hand, a loosely coupled DMC has a larger leakage inductance, which presents a higher impedance to common mode signals, so is less effective in shunting common mode signals to ground via the power supply 22.

What is needed is a PoDL termination technique and DC voltage coupling technique that: 1) couples DC power to the wire pair without requiring the CMC to conduct the full current drawn by the powered device (PD); and 2) results in the DMC not presenting a low impedance to ground at the MDI connector for AC common mode noise signals so as not to adversely impact the effectiveness of an RC termination circuit that is designed to minimize reflections on the wire pair.

SUMMARY

In one embodiment of a PoDL system, a PHY has its inputs connected to AC-coupling capacitors to block any DC voltage. A CMC is connected in series between the capacitors and wires in a twisted wire pair.

A first DMC is connected to nodes between the PHY and the CMC. The first DMC has windings that are tightly coupled, so that the first DMC has a large coefficient of magnetic field coupling, for example, a value greater than 0.90. The first DMC is coupled to a first output of a multiphase power supply. It is assumed the power supply presents a low impedance to ground, which is characteristic of a voltage source. The first DMC, being tightly coupled, presents a very low impedance between the CMC and the power supply for AC common mode noise.

A second DMC is connected to nodes between the CMC and the wire pair. An RC termination circuit is also connected to the wire pair and is designed to prevent reflections of common mode signals. The second DMC has windings that are loosely coupled, so that the second DMC has a low coefficient of magnetic field coupling, for example, less than 0.70. The second DMC, being loosely coupled, presents a relatively high impedance between the wires and the power supply for typical AC common mode noise. This coupling coefficient is low enough such that the leakage inductance presents a sufficiently high common mode impedance so as to preserve the impedance of the common mode RC terminations. The second DMC is coupled to a second output of the multi-phase power supply, so that DC power is coupled to the wire pair by both the first and second DMCs.

The multiphase power supply can be realized as a voltage source which has a 2-phase output so that a voltage is supplied across the two DMCs. These phases operate in a current sharing mode. The current sharing between the two DMCs can be equal and can also be changed, by adjusting the multiphase power supply, in order to alter the total current through each DMC and the current through the CMC for an optimum design. An example of a multiphase power supply can be a supply made using two LTM8055 regulator modules or two LT3790 controller ICs.

A single-phase power supply can also be used to simultaneously supply current to the two DMCs, with each DMC supplying approximately half the current to the load (the powered device connected to the other end of the wire pair). However, without the controllable current sharing provided by a multiphase power supply, the current in each DMC will be determined by the impedance in each path.

A conventional termination circuit (e.g., an RC circuit) is connected to the ends of the wire pair to optimize the termination impedance to minimize reflections of the common mode signals. Since the second DMC (connected at the line side) has a low coupling coefficient and presents a relatively high impedance to the wires when conducting the AC common mode signals, the second DMC does not significantly affect the RC termination circuit's performance, so the termination impedance is preserved.

On the other hand, the first DMC, having a high coupling coefficient, has a very low impedance to AC common noise so attenuates AC common noise received by the wires and any transmitted AC common noise from the PHY.

If each of the DMCs only conducts half of the power supply current, the CMC only needs to have half the current rating and can be less expensive. The sharing ratio can be altered for optimized device design.

Tight coupling and loose coupling DMCs are commercially available from various manufacturers. Techniques to adjust the magnetic coupling coefficient of windings are well known in the field of transformer design.

Other embodiments are described.

BRIEF DESCRIPTION OF THE DRAWINGS

Elements that are the same or equivalent in the various figures are labelled with the same numerals.

DETAILED DESCRIPTION OF THE EMBODIMENTS

Figure 3:
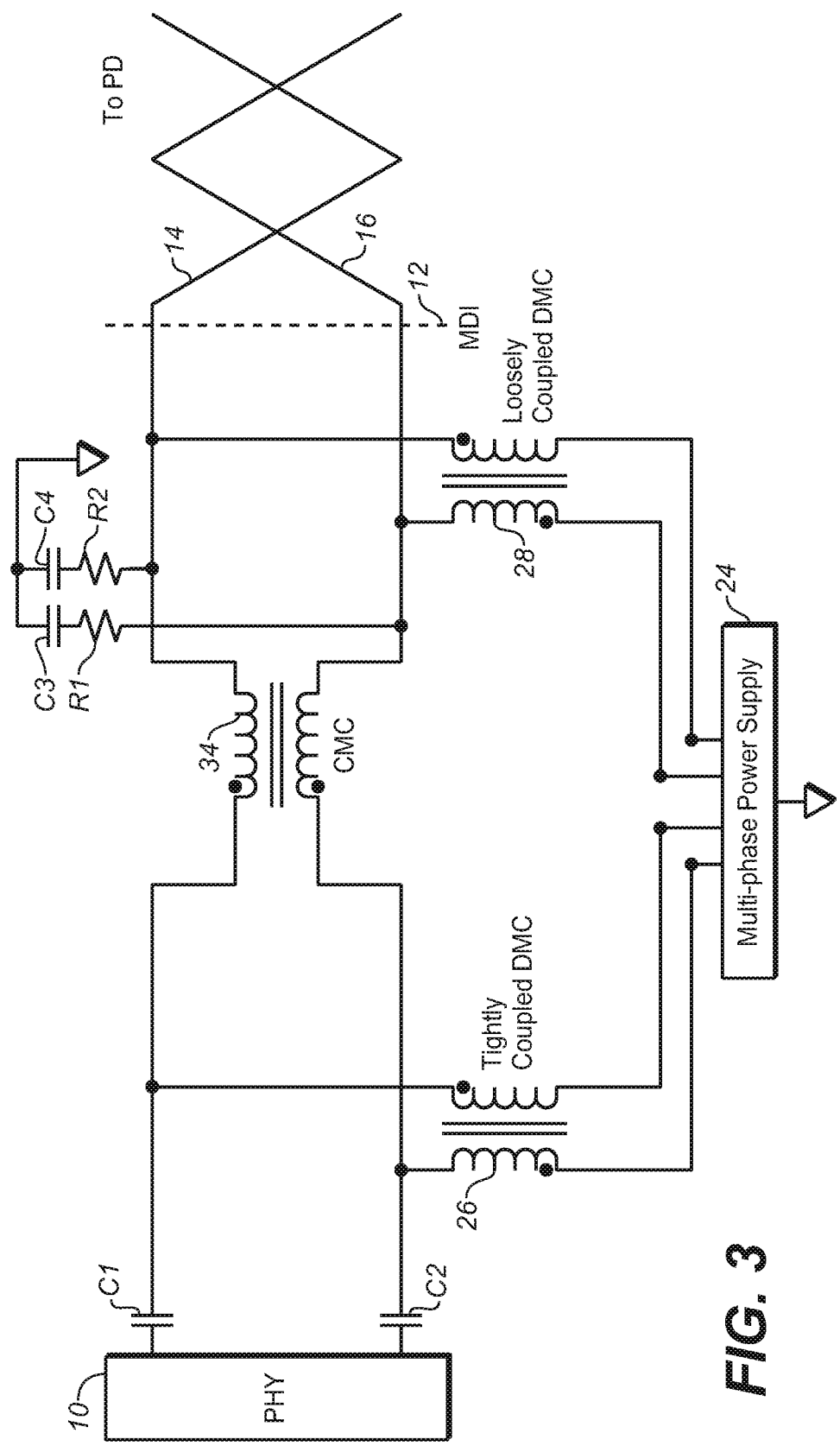
FIG. 3 illustrates one embodiment of the invention where a multiphase power supply supplies power to a pair of DMCs connected to both sides of the CMC.

FIG. 3 illustrates one embodiment of the invention. A multiphase power supply 24 is connected to the DMCs 26 and 28, to supply power through the DMCs 26 and 28 to supply full DC power to the powered device (PD) coupled to the other ends of the wires 14 and 16 in the twisted wire pair. The DMC 26 is connected between the CMC 34 and the PHY 10, and the DMC 28 is connected between the CMC 34 and the wires 14 and 16 via the MDI connector 12.

Since the windings in the CMC 34 in FIG. 3 have some resistance, there will be a voltage drop across the CMC 34. If it is desired for both DMCs 26 and 28 to supply the same current to the PD, the multiphase power supply 24 needs to take into account the voltage drop across the CMC 34, the difference in the DC resistance of the DMCs 26 and 28, and any other resistance difference in the power path. Sharing current reduces the current requirements of both DMCs 26 and 28, reducing their cost and size. Additionally, since the CMC 34 only needs to pass about half the total PD current, the current requirements of the CMC 34 are reduced by about 50%, reducing its cost and size.

The DMC 26 windings are fabricated to have a high magnetic coupling coefficient, such as greater than 0.90, and preferably greater than 0.95. This is sometimes referred to as the windings being "tightly coupled". The coupling coefficient is typically specified in a DMC data sheet and may be specified as a percentage or a coefficient between 0 and 1, such as 0.90. It can sometimes be specified via a leakage inductance value and, in such a case, the coupling coefficient can be calculated using the open circuit inductance and the leakage inductance. With strong magnetic coupling, there is low leakage inductance. As such, the strongly coupled DMC 26 presents substantially zero impedance to high frequency AC common mode noise, whether supplied by the wires 14 and 16 or by the PHY 10. The power supply 24 has a low impedance to ground (typical of a voltage source). RC termination circuitry, comprising the termination resistors R1 and R2 and capacitors C3 and C4, typically presents an impedance generally matched to the common mode impedance of the wires 14 and 16 for minimum reflection of common mode noise. Other types of termination circuitry may be used.

On the other hand, the DMC 28 is "loosely coupled", meaning that it has a low magnetic coupling coefficient, for example, below 0.70. Due to its high leakage inductance, its impedance to AC common mode noise is high enough so that its impedance does not substantially affect the performance of the RC termination circuitry. Since the combination of the functions of the CMC 34 and the DMC 26 greatly attenuates AC common mode noise, and the RC termination circuitry prevents reflections of this noise, there is improved performance in a high electromagnetic interference (EMI) environment. The DMC 28 also offers some common mode noise shunting, though this is less than that of the DMC 26, as described earlier.

Both DMCs 26 and 28 couple the low frequency DC voltage outputs of the power supply 24 to the wires 14 and 16 with low voltage drop.

For classifying a DMC as being tightly coupled, the coupling coefficient should be high enough to result in a low enough leakage inductance that presents a low impedance to common mode signals in the frequency range of interest. For classifying a DMC as being loosely coupled, the coupling coefficient should be low enough to result in a high enough leakage inductance that presents a high impedance to common mode signals in the frequency range of interest so that the equivalent impedance of the common mode termination circuitry is not significantly altered. In one example, the tightly coupled DMC should have a coupling coefficient of 0.85 or greater (preferably greater than 0.95), and the loosely coupled DMC should have a coupling coefficient of less than 0.75 (preferably less than 0.70).

The AC-coupling capacitors C1 and C2 block the DC voltage but pass the differential data signals. An isolation transformer may be used instead.

The DMCs 26 and 28 may share the same core, to reduce space and cost, or can be separate.

Figure 1:
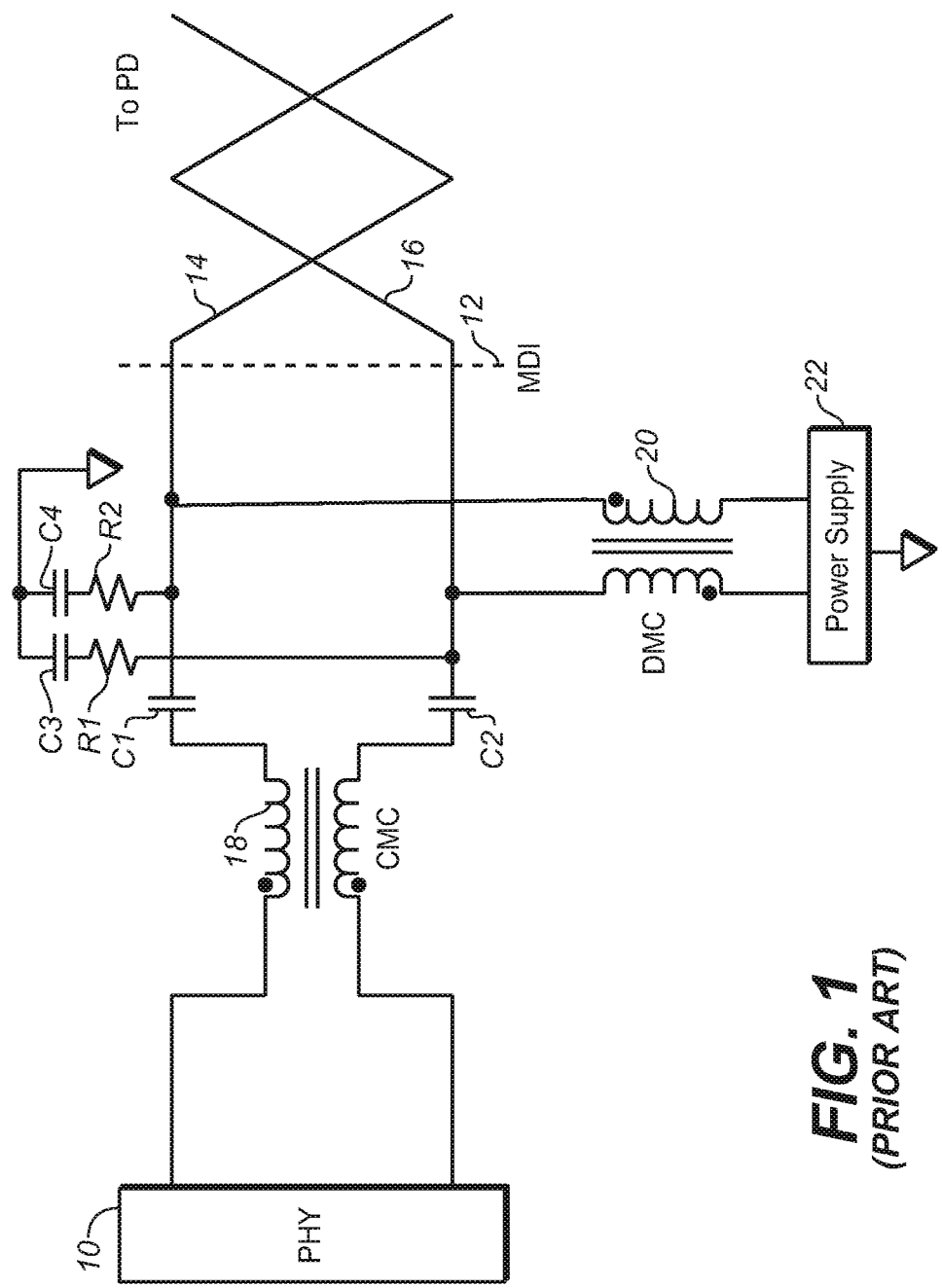
FIG. 1 illustrates a prior art PoDL circuit where a single DMC, on the line side of a CMC, conducts DC voltage and passes AC common mode noise.
Figure 2:
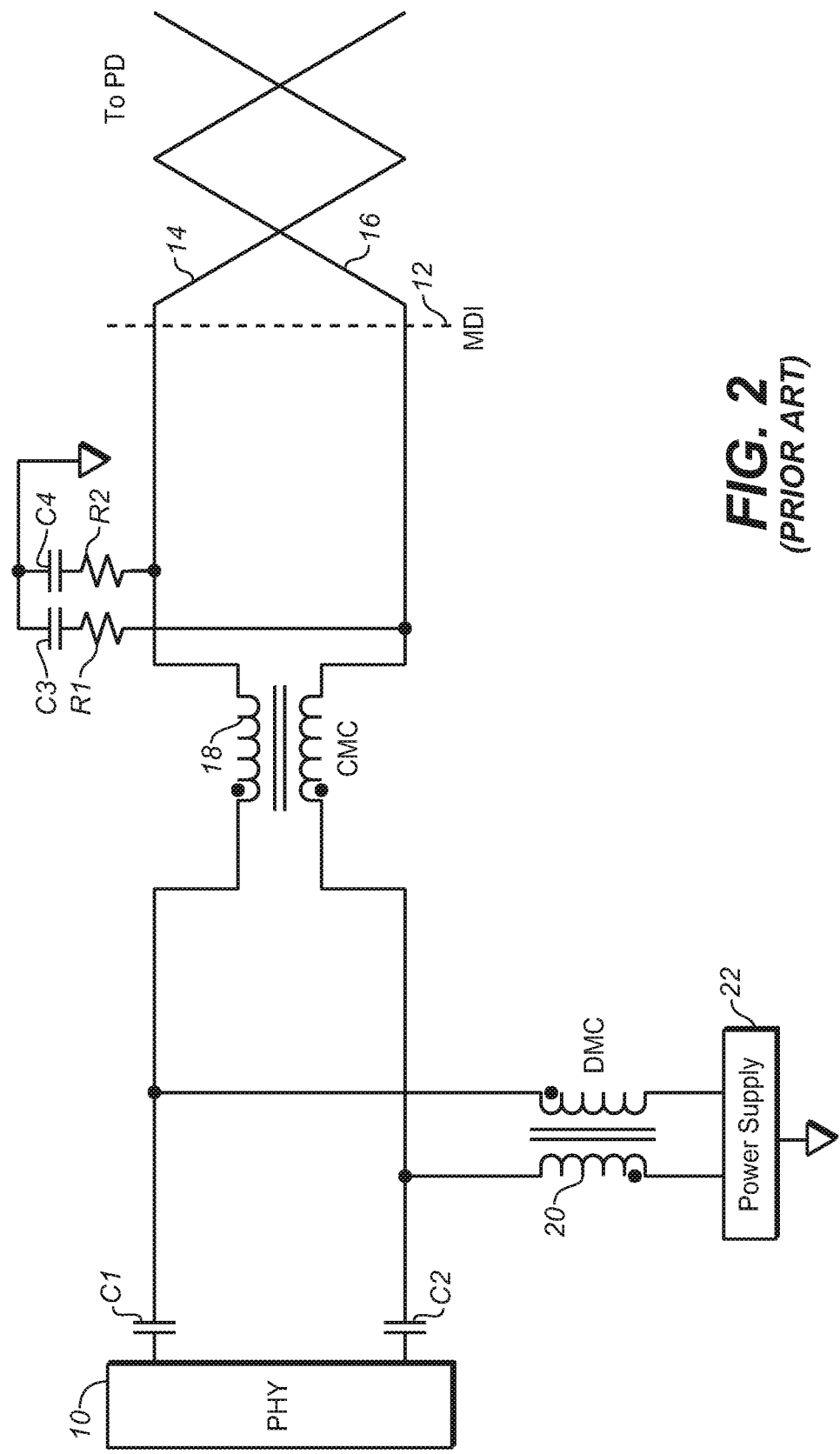
FIG. 2 illustrates a prior art PoDL circuit where a single DMC, on the PHY side of a CMC, conducts DC voltage and passes AC common mode noise.

Although it was mentioned that the current through the CMC 34 can be about 50% less for the same PD current, the same "full current" CMC as the prior art FIG. 2 may be used while providing about double the current to the PD.

By reducing the current requirements of the CMC 34, the size and cost of the CMC 34 can be reduced. Some of the contributing factors of the reduced size and cost can be the use of a thinner gauge winding wire and a smaller volume for thermal dissipation. Reducing the open circuit inductance of the CMC 34 also has benefits, since a fewer number of winding turns are required to achieve the desired open circuit inductance. This can mean a reduced size of the CMC 34 or the use of a thicker wire gauge in the same volume. A thicker wire gauge reduces the DC resistance of the CMC and it can possibly be used at a higher current owing to the lower thermal dissipation. A reduced number of turns can also help in achieving a lower parasitic winding capacitance, which can help in improving the common mode insertion loss.

Figure 4:
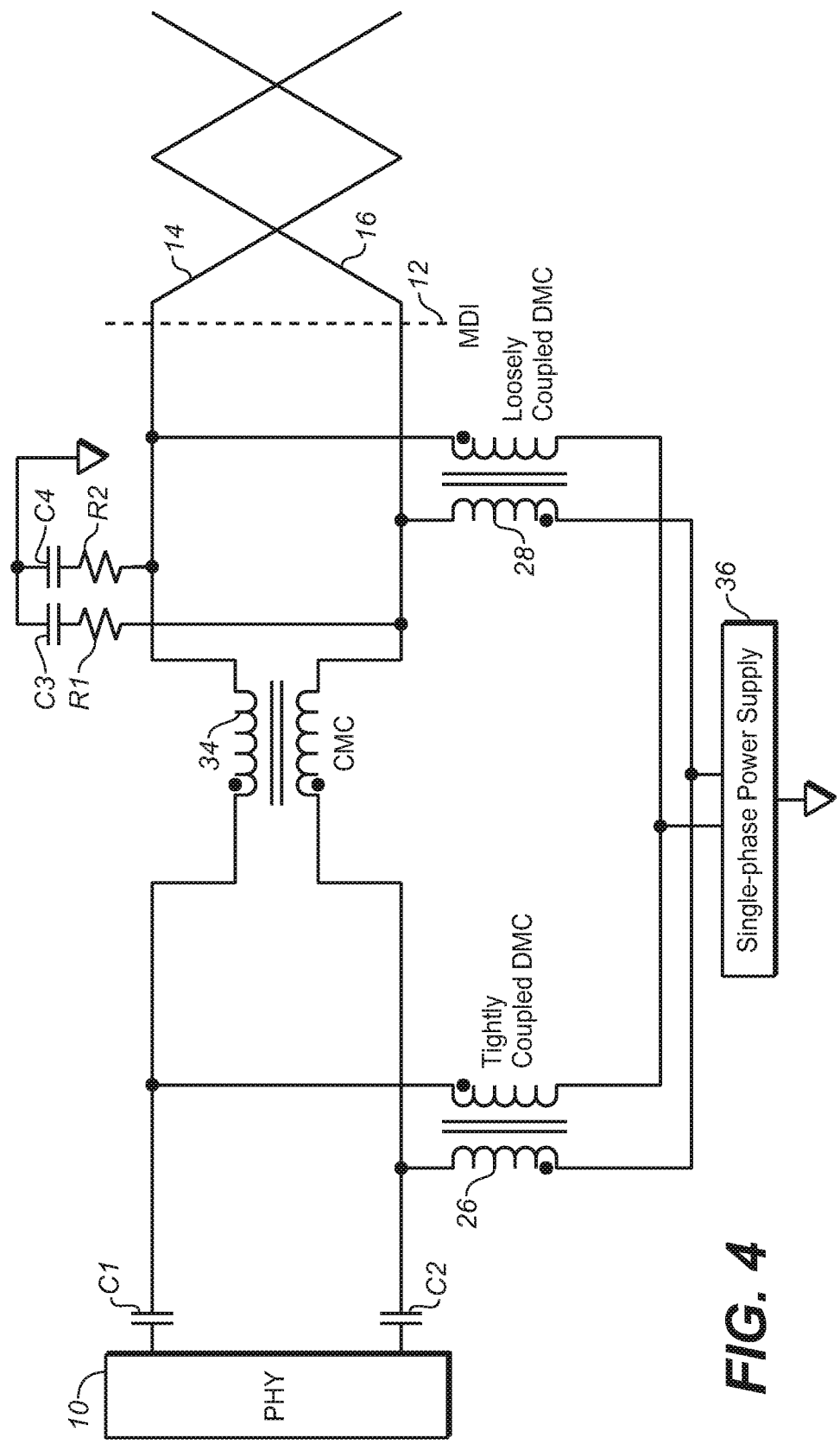
FIG. 4 is the same as FIG. 3 except that the power supply is a conventional DC power supply outputting a single phase to both DMCs, so the DMCs simultaneously supply current to the powered device (PD).

FIG. 4 is the same as FIG. 3 except that the power supply 36 is a conventional DC power supply outputting a single phase. Therefore, the DMCs 26 and 28 simultaneously supply current to the PD. Since there is a small voltage drop across the CMC 34, due to winding resistance, the current supplied by the tightly coupled DMC 26 will be slightly lower than the current supplied by the loosely coupled DMC 28 (assuming other resistances in the power paths such as the DCRs of the DMC 26 and DMC 28 are equal).

In the remaining figures, the power supply can be either a multiphase power supply (with four outputs) or a conventional DC power supply (with two outputs). Although the power supplies in the remaining figures may be multiphase power supplies, they are shown with only two outputs for simplicity.

Figure 5:
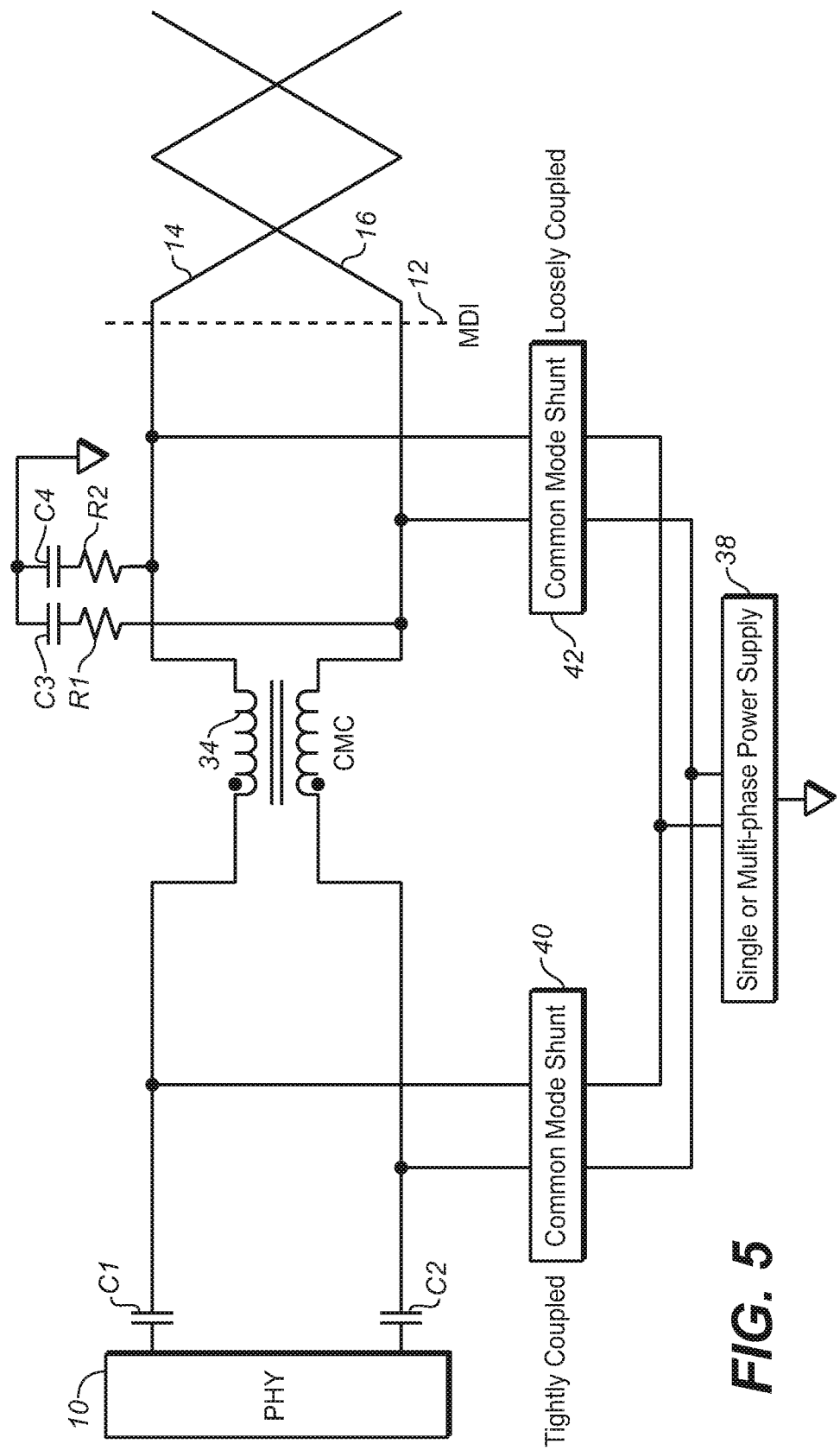
FIG. 5 is a more general configuration that encompasses the circuits of both FIGS. 3 and 4, where the power supply may be either single-phase or multi-phase.

FIG. 5 is a more general configuration that encompasses the circuits of both FIGS. 3 and 4. The power supply 38 may be either single-phase or multiphase. The common mode shunt 40 has strong magnetic coupling between windings, and the common mode shunt 42 has weak magnetic coupling between windings. Both common mode shunts 40 and 42 provide a high impedance to differential signals but provide a much lower impedance to AC common mode signals. The shunts may be DMCs. DC power signals can pass through bi-directionally.

Figure 6:
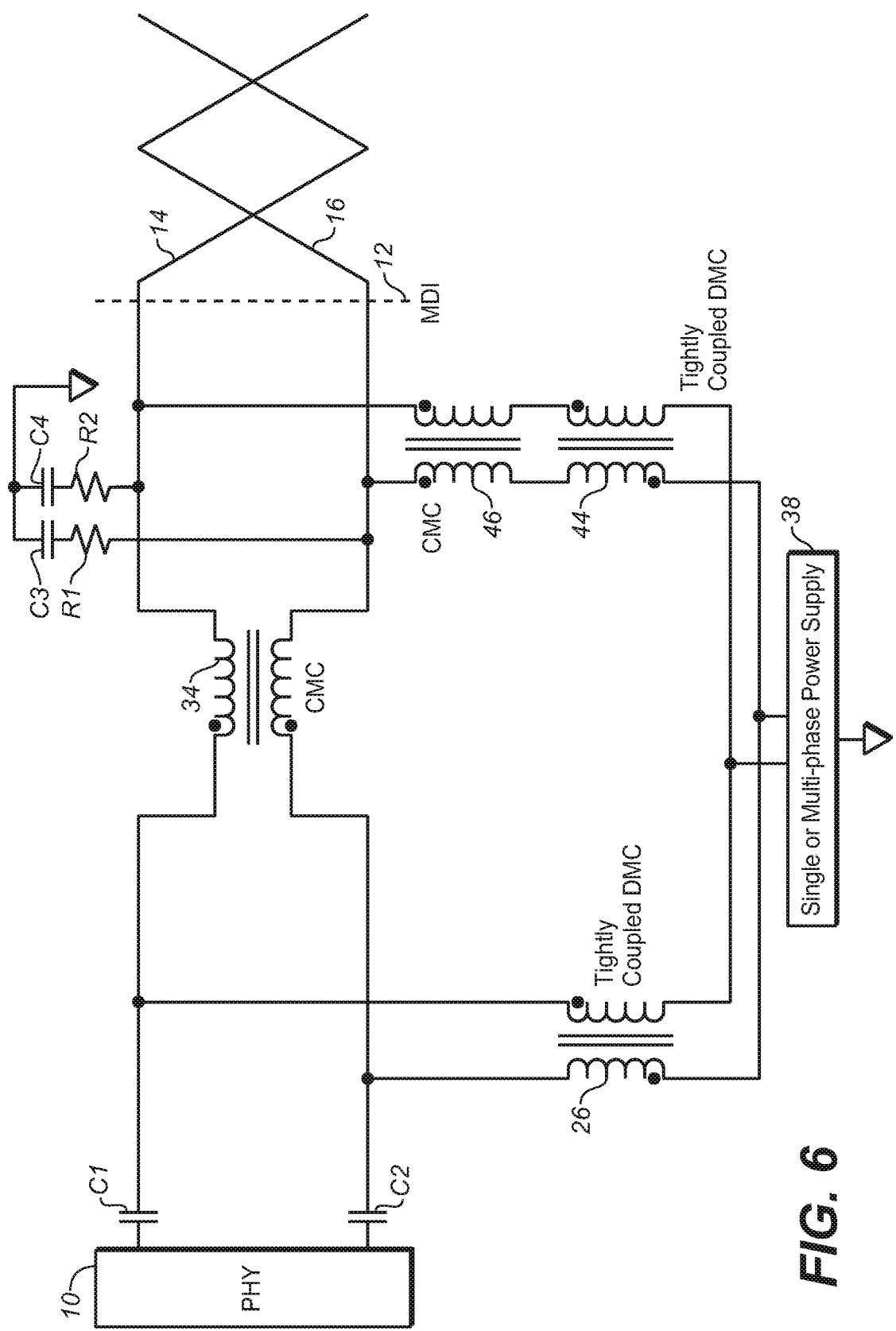
FIG. 6 illustrates another embodiment of the invention where the line-side "loosely coupled" DMC of FIG. 3 is replaced with a combination of a "tightly coupled" DMC and a second CMC.

FIG. 6 illustrates another embodiment of the invention where the line-side "loosely coupled" DMC 28 of FIG. 3 or 4 is replaced with a combination of a "tightly coupled" DMC 44 and a second CMC 46. The CMC 46 prevents the DMC 44 from shorting out the termination circuitry (resistors R1 and R2 and capacitors C3 and C4) for AC common mode noise. The CMC 34 presents a high impedance to AC common mode noise but passes differential signals. The CMC 46 may be replaced with a pair of matched inductors that are not magnetically coupled. The DC voltage from the power supply 38 (whether multi-phase or single phase) passes through the DMC 44 and CMC 46 with very low attenuation, so the PD current is shared by the DMC 26 and the series combination of the CMC 46 and DMC 44. The CMCs 34 and 46 and the DMCs 26 and 44 conduct about half the PD current so the current capacity of those components may be half of the maximum PD current. The combination of the CMC 34 and the DMC 26 greatly attenuate the AC common mode noise.

Figure 7:
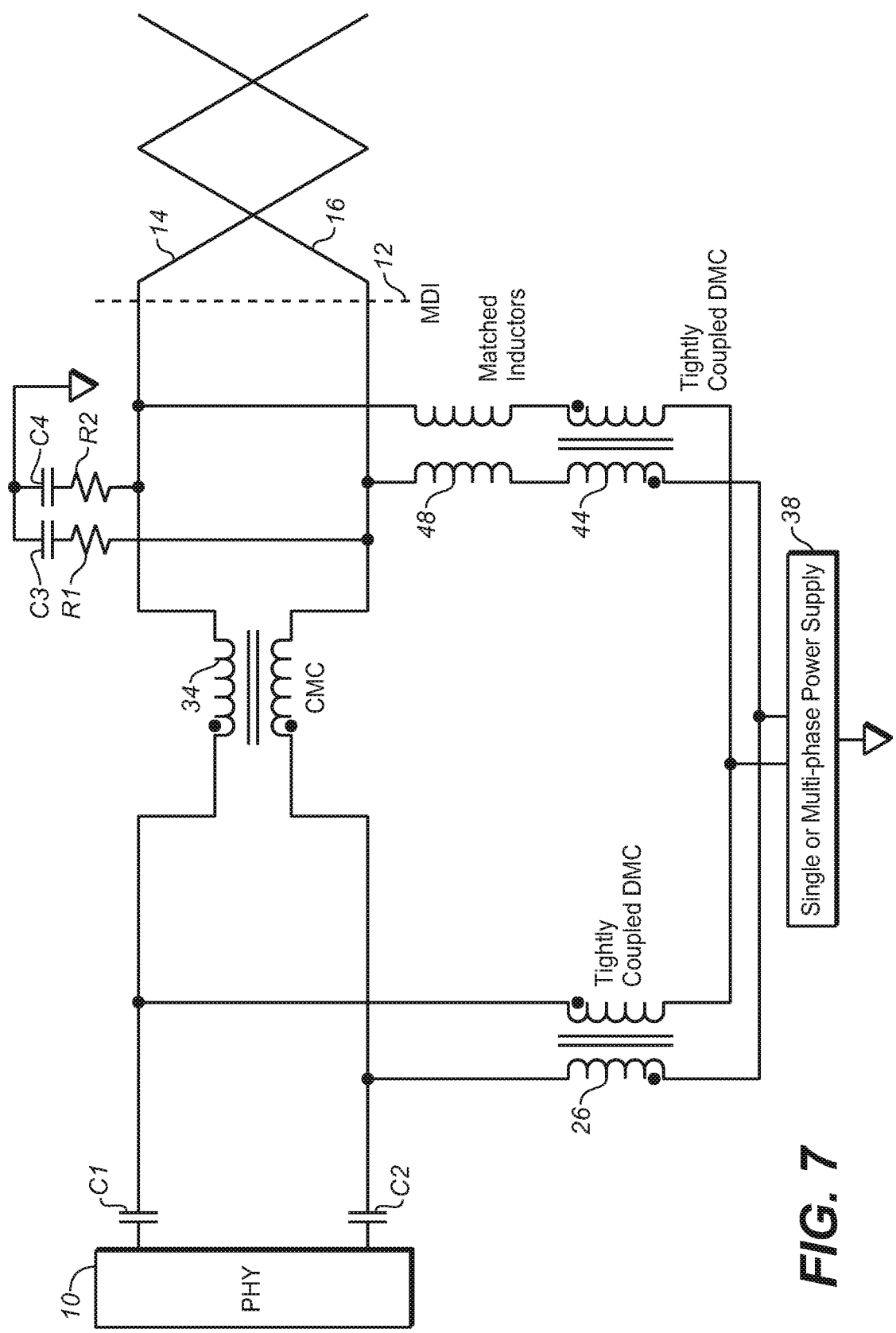
FIG. 7 is similar to FIG. 6 except that the CMC of FIG. 6 is replaced by a pair of matched inductors.

FIG. 7 is similar to FIG. 6 except that the CMC 46 of FIG. 6 is replaced by a pair of matched inductors 48. The matched inductors 48 essentially block AC common mode noise and the differential data but freely pass the DC voltage from the power supply 38. The matched inductors 48 add common mode inductance to help mitigate reflections.

Figure 8:
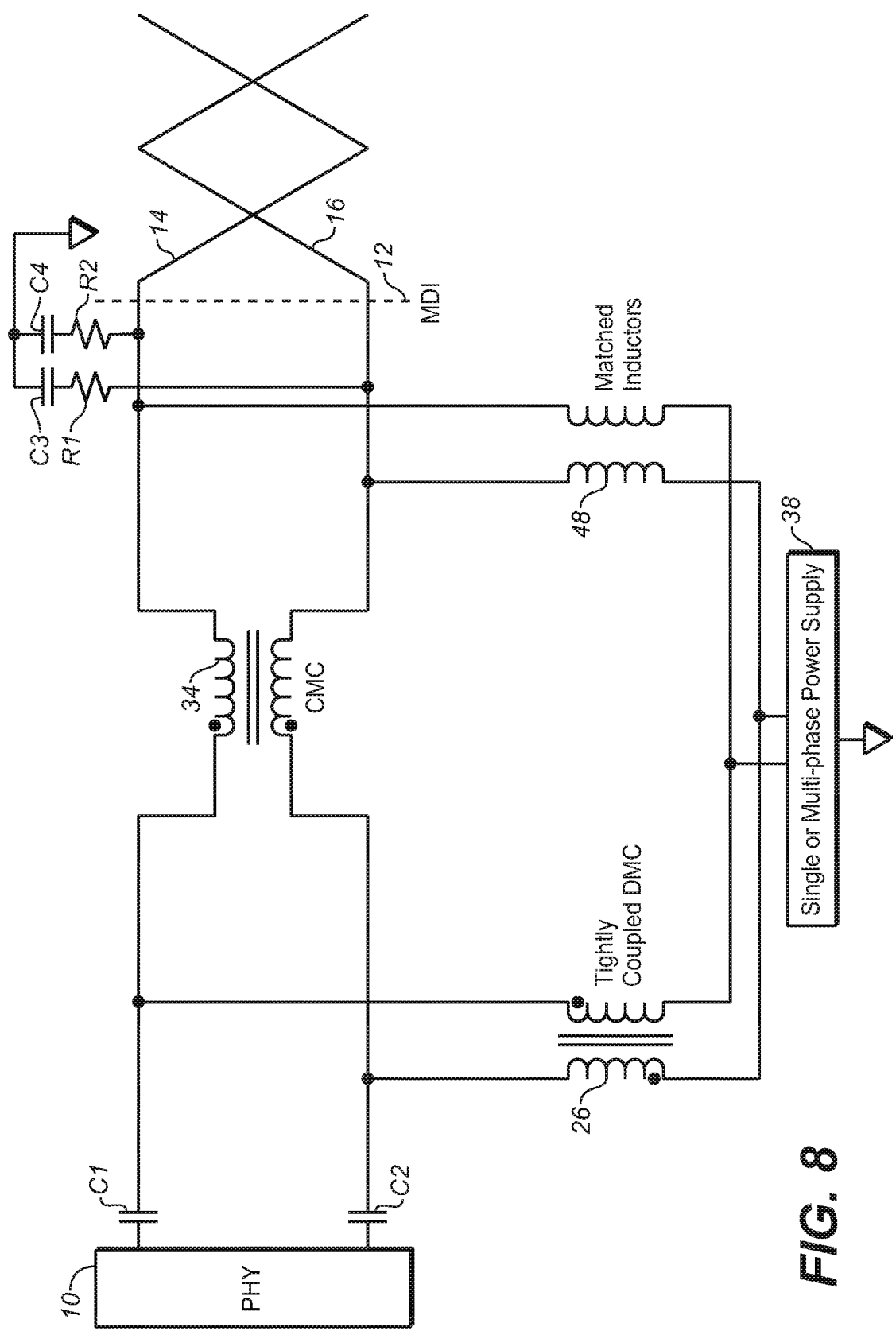
FIG. 8 shows a configuration where the line-side DMC is replaced with a pair of matched inductors, where the matched inductors pass the DC voltage but present a high impedance to the AC common mode noise.

FIG. 8 shows a configuration where the line-side DMC is replaced with a pair of matched inductors 48. The matched inductors 48 pass the DC voltage but present a high impedance to the AC common mode noise and the differential data. All the AC common mode noise attenuation is accomplished by the CMC 34 and tightly coupled DMC 26. The matched inductors 48 may be replaced with a second CMC provided that the CMC can support the DC magnetic flux.

Figure 9:
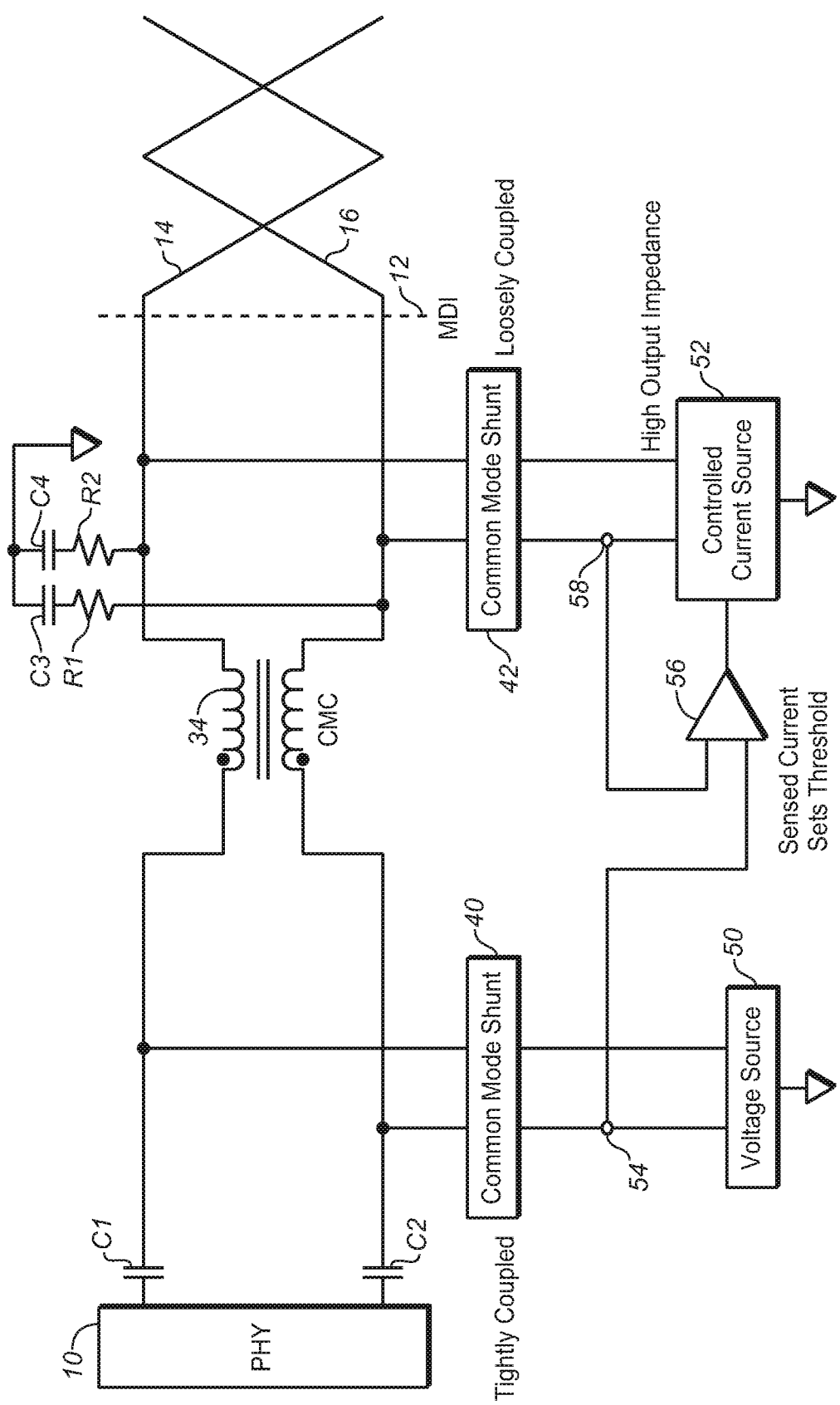
FIG. 9 illustrates an embodiment where the common mode shunts may be the DMCs previously described and where the power supply is replaced with a DC voltage source on the PHY side and a slave current source on the line side.

FIG. 9 illustrates an embodiment where the common mode shunt 42 has windings that are loosely coupled, and the common mode shunt 40 has windings that are tightly coupled. The shunts 40 and 42 may be DMCs. The power supply is replaced with a DC voltage source 50 on the PHY 10 side and a slave current source 52 on the line side. The current source 52 has a high output impedance, typical of a current source.

The DC voltage from the voltage source 50 freely passes through the common mode shunt 40 and the CMC 34 to supply DC power to the PD. A current detector 54 detects the current, and a corresponding voltage signal is applied to a differential amplifier 56. Another input into the differential amplifier 56 is a voltage output by a second current detector 58, corresponding to the current output from the current source 52. The output of the differential amplifier 56 controls the current output from the current source 52. The feedback causes the current output from the current source 52 to match the current output by the DC voltage source 50, so current is precisely shared by the two shunts 40 and 42, and the CMC 34 conducts only half the PD current. If the current source 52 presents a high impedance to ground, it does not matter if the windings in the common mode shunt 42 (e.g., a DMC) are tightly coupled or loosely coupled since the common mode termination circuitry's designed impedance to ground will be preserved by this high impedance in series with the impedance of the shunt 42.

Figure 10:
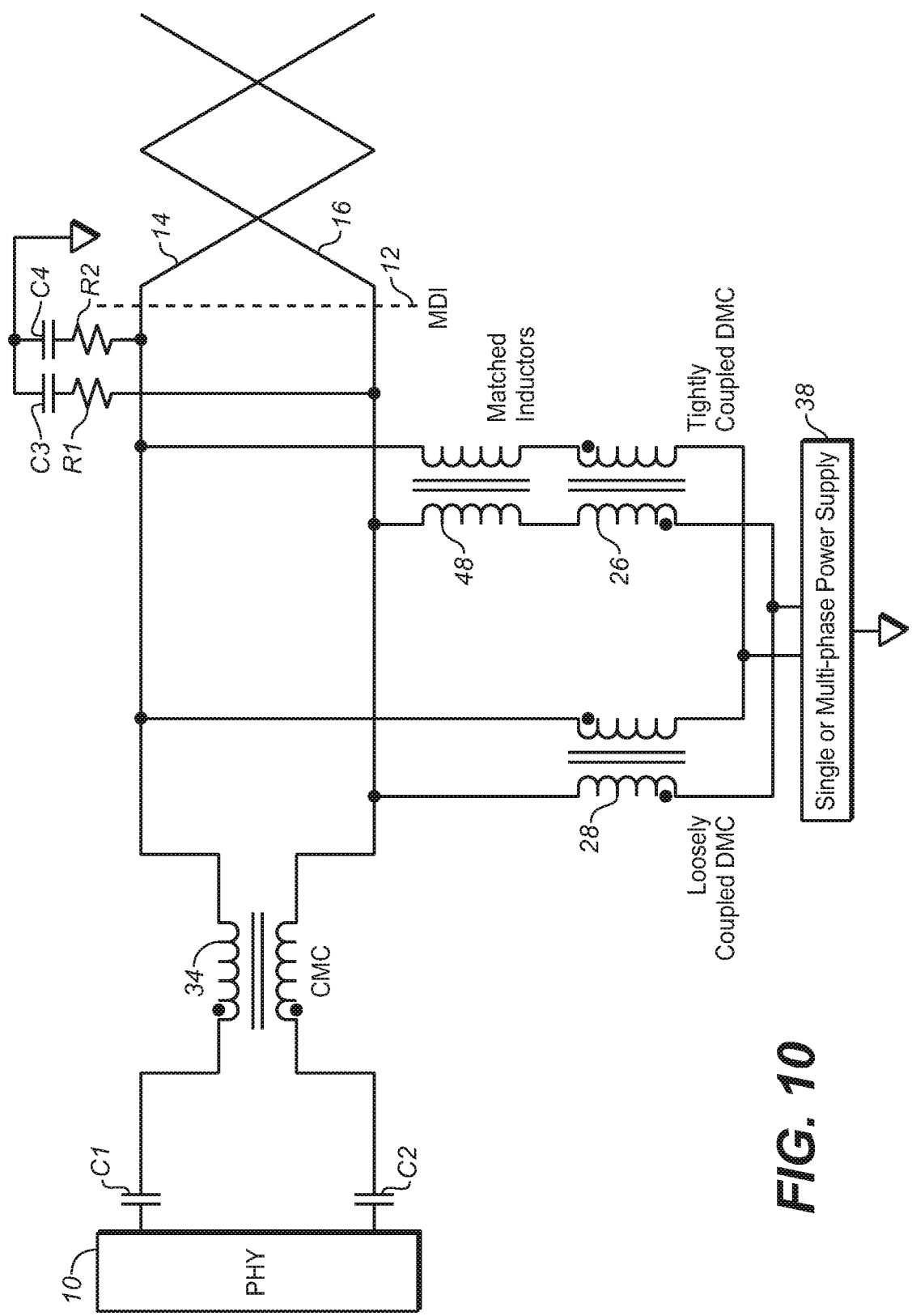
FIG. 10 illustrates an embodiment where the tightly coupled DMC, the matched inductors, and the loosely coupled DMC are on the line side of the CMC, so the CMC does not conduct any of the PD current and thus has a very low current requirement.

In the embodiment of FIG. 10, the tightly coupled DMC 26 and the loosely coupled DMC 28 are on the line side of the CMC 34, so the CMC 34 does not conduct any PD current and may have a very low current requirement. The DMCs 26 and 28 share the PD current. The tightly coupled DMC 26 is connected to the wires 14 and 16 via matched inductors 48, and the inductors 48 present a high impedance to the AC common mode noise and differential data. Since the loosely coupled DMC 28 does not present a low impedance to AC common mode noise, and the inductors 48 present a high impedance to AC common mode noise, the operation of the RC termination circuitry is not adversely affected.

Figure 11:
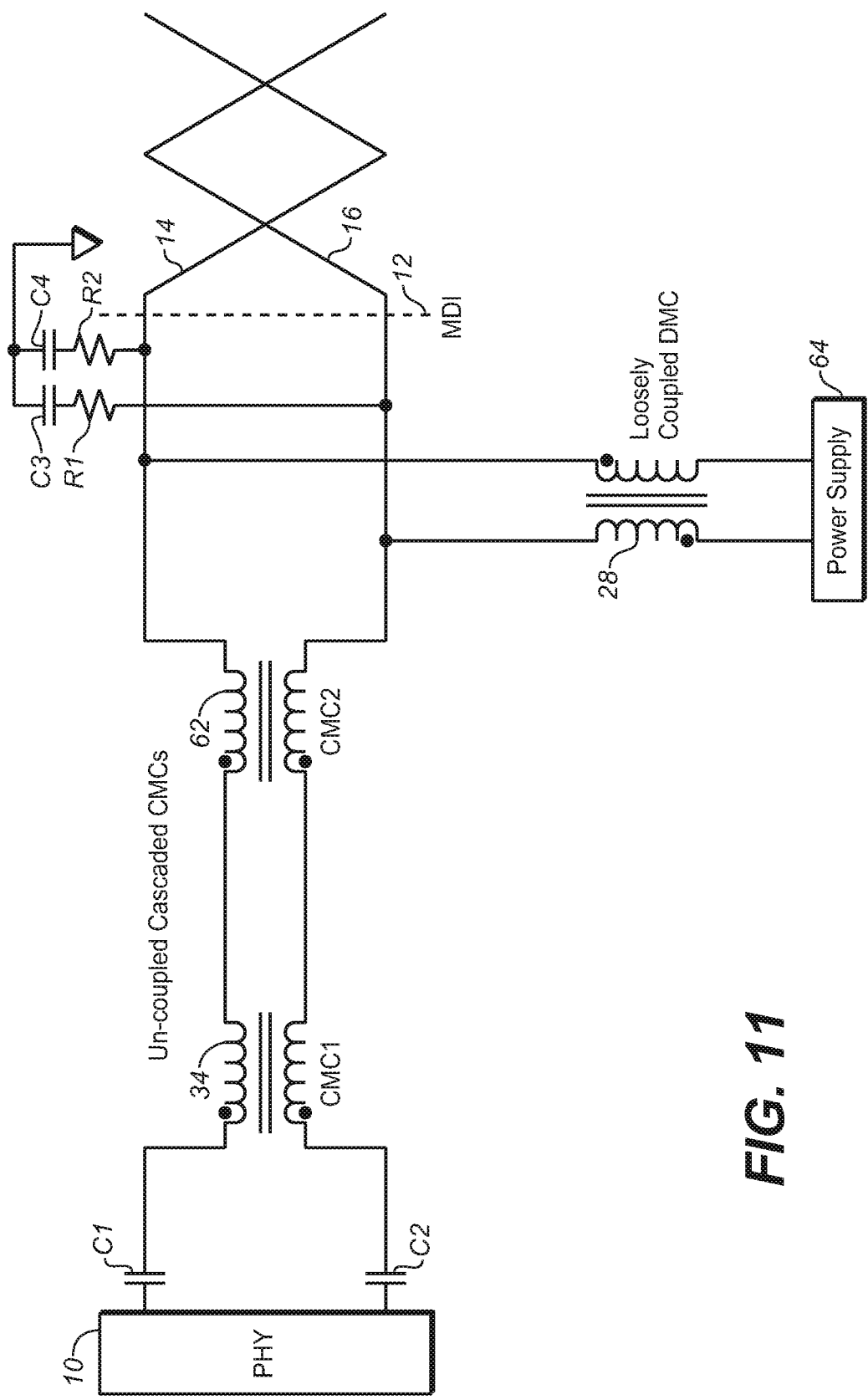
FIG. 11 illustrates how the AC common mode noise can be further attenuated by providing two un-coupled CMCs in series.

FIG. 11 illustrates how the AC common mode noise can be further attenuated by adding another CMC 62 in series (cascaded) with the CMC 34. The CMCs 62 and 34 are not magnetically coupled. The loosely coupled DMC 28 passes the DC voltage from the power supply 64. The DMC 28 does not present a low impedance to the RC termination circuitry for AC common mode noise so does not adversely affect the termination circuitry's performance for minimizing reflections of AC common mode noise. The two CMCs may be instead on the line side, but they will then have to conduct the full PD current.

Figure 12:
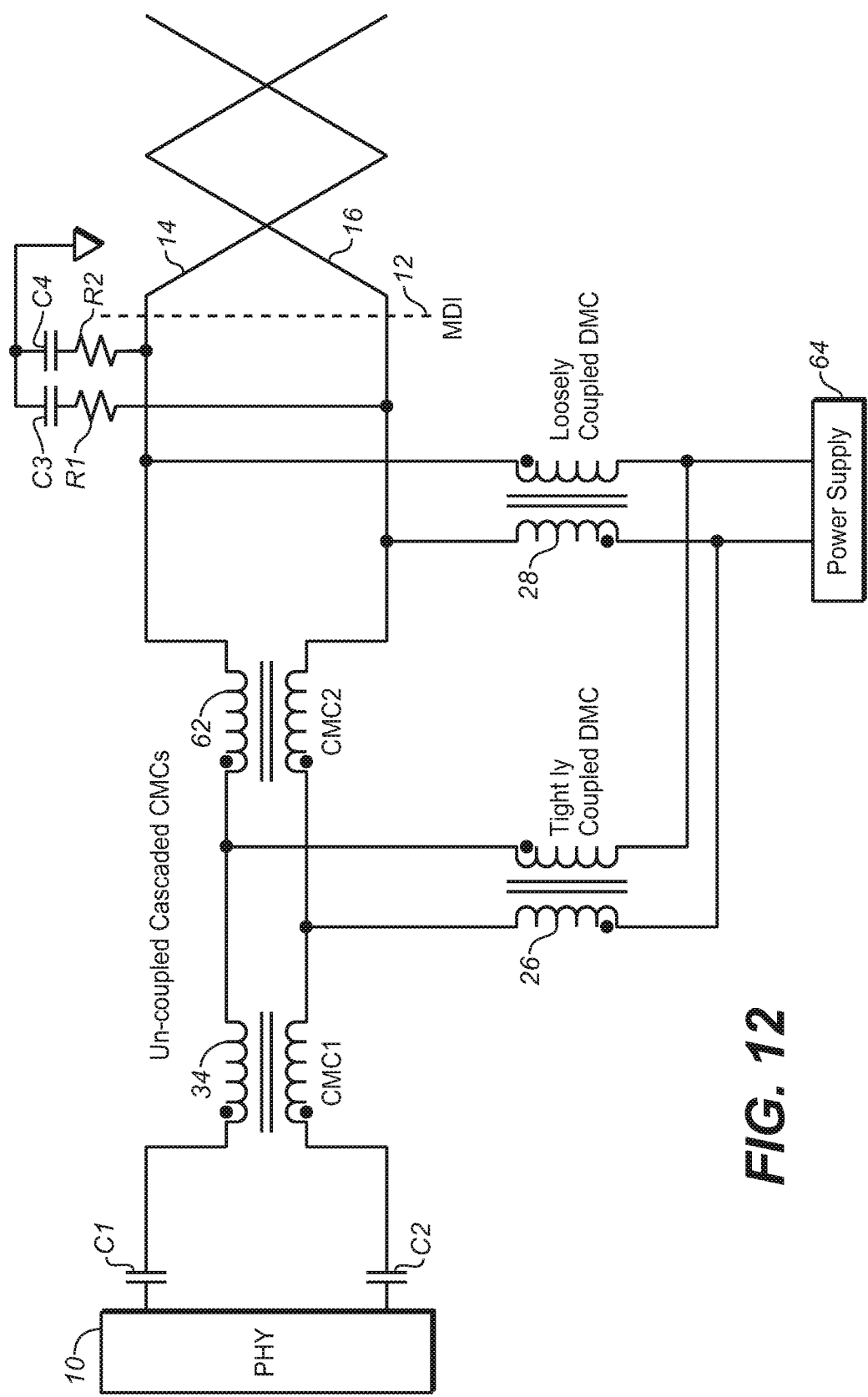
FIG. 12 illustrates the circuit of FIG. 11 but with a tightly coupled DMC connected between the two CMCs.

FIG. 12 illustrates the circuit of FIG. 11 but with a tightly coupled DMC 26 connected between the two CMCs 34 and 62. Using the CMC 62 between the DMC 26 and the MDI 12 helps in reducing the impact of common mode to differential mode conversion of common mode noise from the line side that might occur due to imbalance in the DMC 26. For example, the common mode to differential mode conversion due to imbalance in the DMC 26 will be mitigated by the CMC 62 for common mode noise signals coming in from the line side and by CMC 34 for the common mode signals from the PHY 10. The common mode signal is attenuated by the CMC 62 before it is converted to differential mode by the DMC 26. Hence, the same amount of imbalance causes a lesser mode conversion as the DMC 26 is subjected to an attenuated common mode signal. This is significant because mode conversion might cause electromagnetic immunity and electromagnetic compatibility issues.

Cascaded CMCs may be used with any embodiment. For example, series CMCs may be connected in the circuit of FIG. 3, with the tightly coupled DMC connected between the CMCs or on the PHY side of a CMC.

Although only the power injecting side of the PoDL system is shown in the figures, the differential data path of the PD side (including RC terminations and CMC configurations) may be identical to that shown in the power injecting side for attenuating AC common mode noise and minimizing reflections.

Any combinations of the features of the various figures may be combined to realize the various advantages described herein.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A Power over Data Lines (PoDL) circuit for connection to a first wire and a second wire of a wire pair, the wire pair for connection to a powered device, the circuit comprising:
   a transceiver having a first terminal and a second terminal, the transceiver for transmitting differential data over the first wire and the second wire and receiving differential data from the first wire and the second wire;
   a first AC-coupling device coupled to the first terminal;
   a second AC-coupling device coupled to the second terminal;
   a first common mode choke (CMC) having a first winding coupled in series between the first AC-coupling device and a third terminal of the PoDL circuit for connection to the first wire, and a second winding coupled in series between the second AC-coupling device and a fourth terminal of the PoDL circuit for connection to the second wire;
   termination circuitry coupled to the third terminal and the fourth terminal, between the wire pair and the first CMC, for terminating the first wire and the second wire to reduce reflections;
   a first differential mode choke (DMC) coupled to nodes between the first CMC and the transceiver; and a second DMC coupled to nodes between the first CMC and the third terminal and the fourth terminal, between the wire pair and the first CMC.

2. The circuit of claim 1 further comprising a power supply coupled to the first DMC and the second DMC for supplying a DC voltage across the first DMC and across the second DMC, such that DC power and differential data are transmitted over the first wire and the second wire.

3. The circuit of claim 2 wherein the power supply is a multiphase power supply that supplies power to the first DMC and the second DMC.

4. The circuit of claim 2 wherein the power supply is a single-phase power supply that supplies power to the first DMC and the second DMC.

5. The circuit of claim 2 further comprising a powered device coupled to the wire pair for being powered by the power supply.

6. The circuit of claim 1 wherein the first DMC has a magnetic coupling coefficient greater than 0.85.

7. The circuit of claim 6 wherein the second DMC has a magnetic coupling coefficient less than 0.75.

8. The circuit of claim 1 wherein the termination circuitry comprises a resistor-capacitor circuit coupled to the third terminal and the fourth terminal.

9. The circuit of claim 8 wherein the resistor-capacitor circuit comprises:
a first resistor and first capacitor connected between the third terminal and ground; and
a second resistor and second capacitor connected between the fourth terminal and ground.

10. The circuit of claim 1 further comprising a second CMC in series with the first CMC.

11. The circuit of claim 10 wherein the first DMC is coupled between the second CMC and the first CMC.

12. The circuit of claim 10 wherein the second CMC is coupled between the second DMC and the third terminal and the fourth terminal.

13. The circuit of claim 1 further comprising the third terminal and the fourth terminal being connected to the wire pair.

14. The circuit of claim 1 further comprising a pair of matched inductors coupled between the second DMC and the third terminal and the fourth terminal.

15. The circuit of claim 1 further comprising a second CMC coupled between the second DMC and the third terminal and the fourth terminal.

16. A Power over Data Lines (PoDL) circuit for connection to a first wire and a second wire of a wire pair, the wire pair for connection to a powered device, the circuit comprising:
a transceiver having a first terminal and a second terminal, the transceiver for transmitting differential data over the first wire and the second wire and receiving differential data from the first wire and the second wire;
a first AC-coupling device coupled to the first terminal;
a second AC-coupling device coupled to the second terminal;
a first common mode choke (CMC) having a first winding coupled in series between the first AC-coupling capacitor and a third terminal of the PoDL circuit for connection to the first wire, and a second winding coupled in series between the second AC-coupling capacitor and a fourth terminal of the PoDL circuit for connection to the second wire;
termination circuitry coupled to the third terminal and the fourth terminal, between the wire pair and the first CMC, for terminating the first wire and the second wire to reduce reflections;
a first differential mode choke (DMC) coupled to nodes between the first CMC and the transceiver;
a first inductor having one end coupled to a first node between the first CMC and the third terminal, between the wire pair and the first CMC; and
a second inductor having one end coupled to a second node between the first CMC and the fourth terminal, between the wire pair and the first CMC.

17. The circuit of claim 16 further comprising a power supply coupled to the first DMC, a second end of the first inductor, and a second end of the second inductor for supplying a DC voltage across the first DMC and across the first inductor and the second inductor, such that DC power and differential data are transmitted over the first wire and the second wire.

18. The circuit of claim 16 wherein the first inductor and the second inductor are matched inductors.

19. The circuit of claim 16 wherein the first inductor and the second inductor are windings in a second CMC.

20. A method performed by a Power over Data Lines (PoDL) circuit connected to a first wire and a second wire of a wire pair, the wire pair for connection to a powered device, the method comprising:
transmitting differential data over the first wire and the second wire and receiving differential data from the first wire and the second wire by a transceiver having a first terminal and a second terminal;
blocking DC voltages from being applied to the first terminal and the second terminal;
conducting the differential data through a first common mode choke (CMC) having a first winding coupled in series between the transceiver and the first wire, and a second winding coupled in series between the transceiver and the second wire;
terminating the first wire and the second wire with termination circuitry to reduce reflections, the termination circuitry being connected between the wire pair and the first CMC; and
supplying DC power to the wire pair by a power supply coupled to a first differential mode choke (DMC) and a second DMC, such that DC power and differential data are transmitted over the first wire and the second wire,
wherein the first DMC is coupled to nodes between the first CMC and the transceiver,
wherein the second DMC is coupled to nodes between the first CMC and the wire pair.

21. The method of claim 20 wherein the first DMC has a magnetic coupling coefficient greater than 0.85.

22. The method of claim 21 wherein the second DMC has a magnetic coupling coefficient less than 0.75.

23. The method of claim 20 wherein the termination circuitry comprises a resistor-capacitor circuit coupled to the third terminal and the fourth terminal.

* * * * *